United States Patent [19]

Nicholas

[11] 4,083,098
[45] Apr. 11, 1978

[54] METHOD OF MANUFACTURING ELECTRONIC DEVICES

[75] Inventor: Keith H. Nicholas, Reigate, England

[73] Assignee: U.S. Philips Corporation, New York, N.Y.

[21] Appl. No.: 731,339

[22] Filed: Oct. 12, 1976

[30] Foreign Application Priority Data

Oct. 15, 1975 United Kingdom ............... 42223/75

[51] Int. Cl.$^2$ ............................................ B01J 17/00
[52] U.S. Cl. ........................................ 29/578; 357/24
[58] Field of Search ..................... 29/578, 579; 357/24

[56] References Cited

U.S. PATENT DOCUMENTS

3,927,468  12/1975  Anthony et al. ....................... 29/578

Primary Examiner—Gerald A. Dost
Attorney, Agent, or Firm—Frank R. Trifari

[57] ABSTRACT

A method of manufacturing an electronic device, comprising a plurality of closely spaced conductive layers on a substrate, said method comprising the steps of depositing said substrate a layer of polycrystalline semiconductor material, providing at least one aperture defined in and extending through said polycrystalline layer, effecting a material treatment via an exposed edge of said polycrystalline layer in said aperture in the presence of a masking layer on said polycrystalline layer, said treatment being effected to convert a narrow strip portion of the polycrystalline layer of substantially uniform width and underlying the masking layer adjacent the aperture into material insoluble in an etchant specific for the untreated part of said polycrystalline layer, removing said masking layer and selectively removing, with the use of said etchant, the untreated polycrystalline semiconductor material to leave a narrow strip of material present on and raised above the substrate, and effecting a deposition of conductive material on the upper surface of said strip of material and on said substrate at least at opposite sides of said strip, said conductive material being deposited in a thickness less than the height of said strip above the substrate and a discontinuity in said deposited conductive material being formed at said strip.

14 Claims, 20 Drawing Figures

METHOD OF MANUFACTURING ELECTRONIC DEVICES

This invention relates to methods of manufacturing electronic devices comprising a plurality of closely spaced conductive layers on a substrate, particularly, but not exclusively, to methods of manufacturing a charge coupled device in which the substrate comprises a body of semiconductor material having a surface insulating layer and on which insulating layer a plurality of closely spaced conductive layers of metal are present.

For providing a plurality of closely spaced conductive layers on an insulating layer present on a semiconductor body surface, various methods are known in the semiconductor art. In the formation of some charge coupled devices, for example in some three-phase surface channel charge coupled devices, there is a basic requirement to form a plurality of conductive layers on an insulating layer present on a semiconductor body surface with a spacing between adjoining conductive layers of less than 1 micron. It is in part due to the manufacturing difficulties experienced in attempting to provide conductive layers consistently with such a separation, that more complex structures for the capacitive generation of electric fields in charge coupled devices have been proposed. For producing conductive layers having a narrow spacing conventional lithography is not satisfactory because there exists a limitation, in the region of approximately 3 microns, below which apertures in conductive layers cannot be formed reproducibly. As an attempt to overcome this limitation various other techniques have been proposed for forming the closely spaced conductive layers but these have the disadvantage that they require the provision of insulating layers of different thicknesses or depend on critical etching processes. In particular one method that has been proposed (see U.K. patent specification No. 1,388,535) employs the deposition of first and second metal layers with an etching of the first deposited layer carried out prior to depositing the second layer. The second metal layer is deposited in apertures etched in the first layer and in the shadow of an underetched photoresist layer present on the remaining portions of the first deposited layer. The underetching of the photoresist layer on the first metal layer has been found difficult to control to obtain a reproducible sub-micron spacing between the deposited second metal layer portions and the intermediate remaining first metal layer portions.

According to the invention there is provided a method of manufacturing an electronic device comprising a plurality of closely spaced conductive layers on a substrate, wherein on the substrate there is deposited a layer of polycrystalline semiconductor material, at least one aperture is defined in and extending through the polycrystalline layer, and a material treatment is effected via an exposed edge of the polycrystalline layer in the aperture in the presence of a masking layer on the polycrystalline layer. This treatment is effected to convert a narrow strip portion of the polycrystalline layer of substantially uniform width and underlying the masking layer adjacent the aperture into material insoluble in an etchant specific for the untreated part of the polycrystalline layer, the masking layer is removed, and, using said etchant, the untreated polycrystalline semiconductor material is removed to leave a narrow strip of material present on and raised above the substrate. A deposition of conductive material is effected on the upper surface of the strip of material and on the substrate at least at opposite sides of the strip, the conductive material being deposited in a thickness less than the height of the strip above the substrate and a discontinuity in said deposited conductive material being formed at the strip.

In this method it is possible to obtain closely spaced conductive layers in a well-controlled and reproducible manner when the treatment of the exposed polycrystalline semiconductor material in the aperture is chosen so that the conversion in the lateral direction of the narrow strip portion into material insoluble in the said etchant proceeds at a substantially uniform rate.

Various possibilities exist for the treatment used to convert the narrow strip portion into material which is insoluble in an etchant for the untreated polycrystalline material. However in one preferred form the material treatment comprises an oxidation treatment to convert the narrow strip portion into an oxide of the semiconductor material of the polycrystalline layer. It is found that when oxidizing an exposed edge, for example an edge of a polycrystalline silicon layer, the oxidation occurs at a uniform rate along and across the edge and this treatment can be controlled to form a uniform width narrow strip of oxidized polycrystalline silicon which is of less than 1 micron width, for example of 0.5 micron width. Furthermore, as the boundary between the oxidized and unoxidized material is well-defined, as a result of the mechanism by which semiconductor materials are oxidized, the edges of the strip are well-defined after the etching treatment. In the method in accordance with the invention, it is the width of the narrow strip thus produced, in the case referred to above the width of the strip consisting of oxidized polycrystalline semiconductor material, which determines and corresponds substantially to the final separation of the conductive layers.

Although the preferred method of treating the exposed edge of the polycrystalline layer in the aperture thus comprises an oxidation treatment followed by the selective etching of the untreated polycrystalline material, within the scope of the present invention there are other methods, for example methods in which a narrow strip portion adjoining an exposed edge of the polycrystalline layer in the aperture is doped with an impurity to convert it into a form insoluble in the subsequently effected etching treatment. Such a doping may be effected by diffusion. In this manner a narrow strip portion of a high resistivity polycrystalline layer adjoining the exposed edge in the aperture can be rendered relatively highly conductive by diffusion of an impurity, said diffusion proceeding at a controlled uniform rate. Thereafter a selective etching treatment can be effected to remove the higher resistivity portion of the polycrystalline layer not subjected to the impurity diffusion. When using a high resistivity deposited polycrystalline silicon layer the impurity diffused may be boron and the selective etching of the undiffused material effected with an etchant fluid comprising ethylene diamine, pyrocatechol and water. As an alternative the impurity introduction may be effected by ion implantation using an ion beam which is inclined, rather than perpendicular, to the main surface of the body. In this manner the impurity introduction may be effected along one edge only of an aperture and a narrow strip portion defined as a single line of uniform width.

The method in accordance with the invention may be used in the manufacture of various electronic devices, including transistors, integrated circuits and charge coupled devices. In the manufacture of some devices, for example transistors, the conductive material is deposited in part on the surface parts of a substrate consisting of a semiconductor body in order that the conductive layers may form ohmic connections to the semiconductor body. However in other forms, for example in the manufacture of charge coupled devices, the conductive material is deposited on an insulating layer present at the surface of the substrate. Thus, in a preferred form of the method the substrate comprises a body having insulating material provided on a surface thereof, the polycrystalline material being deposited on a surface of the insulating material.

In one such form of the method and, in which the material treatment effected via an exposed edge of the polycrystalline layer in the aperture is an oxidation treatment, the insulating material provided on the surface of the body comprises a first layer of silicon oxide and a second layer of silicon nitride, the deposited polycrystalline material is of silicon and is provided on the silicon nitride layer, the said at least one aperture being provided extending through the polycrystalline silicon layer but not through the silicon nitride layer. In this form the silicon nitride layer is used to mask the underlying silicon oxide layer part and this is important when the underlying silicon oxide layer is on a silicon body surface because the oxidation of the edge of the polysilicon layer to form the said narrow strip could otherwise in some circumstances be accompanied by an undesirable increase in the thickness of the silicon oxide layer part.

In the said one form the method, subsequent to the selective etching of the untreated polycrystalline silicon to leave a narrow strip of silicon oxide and prior to the deposition of the conductive material, the silicon nitride layer part in the aperture may be removed to expose the underlying silicon oxide layer part. In this manner the subsequently effected deposition of the conductive material can be provided on opposite sides of the narrow strip on silicon oxide layer parts of equal thickness. In this method the narrow strip of silicon oxide with the deposited conductive material thereon may be removed by the etching of the remaining silicon nitride layer part present under said strip. In an alternative form the silicon oxide strip and the deposited conductive material thereon is removed by etching with an etchant specific for silicon oxide. In this form the residual silicon nitride layer parts may be left in place between the conductive layers.

In a further form of the method in which the substrate comprises a body having insulating material provided on a surface thereof and the polycrystalline semiconductor is deposited on a surface of the insulating material and in which the treatment effected via an exposed edge of the polycrystalline layer in the aperture is an oxidation treatment, the insulating material provided on the surface of the body comprises a layer of silicon oxide, the deposited layer is of polycrystalline silicon and is provided on said silicon oxide layer, and the said at least one aperture is provided extending through the polycrystalline silicon layer but not into the underlying silicon oxide layer. In this form of the method in the case in which during the oxidation treatment the thickness of the silicon oxide layer part in the aperture increases, for example when the body is of silicon, measures may be taken to ensure that the closely spaced conductive layers when finally provided are provided on silicon oxide layer parts of equal thickness. Thus subsequent to the oxidation treatment and prior to the selective etching of the untreated polycrystalline silicon an etching of the silicon oxide within the aperture may be effected to reduce the thickness of the silicon oxide layer part in the aperture substantially to its value prior to the oxidation treatment.

Alternatively, in such a method in which an increase in the thickness of the silicon oxide layer occurs during the oxidation of the edge of the deposited polycrystalline silicon layer measures may be taken before the oxidation treatment to compensate for the increase in thickness, for example by etching the silicon oxide layer part in the aperture over part of its thickness.

In said further form of the method using an oxidation treatment and a deposited layer of polycrystalline silicon on a silicon oxide layer, subsequent to the deposition of the conductive material, the strip of silicon oxide with the deposited conductive material thereon may be removed by etching of the silicon oxide strip.

In a method in accordance with the invention an aperture comprising a plurality of substantially parallel extending rectangular portions may be defined in the deposited polycrystalline semiconductor layer and the edges of the polycrystalline semiconductor material therein subjected to the treatment to form substantially parallel extending narrow strips which remain after the selective etching of the untreated polycrystalline semiconductor material. In one form in which an oxidation treatment is effected via the exposed edges in the rectangular portions of the aperture the parallel extending substantially rectangular portions of the aperture have a mutual spacing between adjoining edges which is approximately equal to their cross-dimension perpendicular to said adjoining edges. In this manner, a plurality of equally spaced conductive layers in the form of rectangular strips of equal width can be provided, it being assumed that the oxidation of the polycrystalline semiconductor material produces an increase in extent in the direction perpendicular to the exposed edges which approximates to the distance in said direction over which the silicon is consumed in the oxidation treatment.

In a method in accordance with the invention the substrate may be of semiconductor material, for example of silicon, and the deposited conductive material may be of metal, for example aluminium. Thus as already described the method may be employed in the manufacture of a charge coupled device having a plurality of uniformly spaced metal layers situated on insulating layer parts of substantially uniform thickness present on a semiconductor body surface.

Thus in one such method in which a charge coupled device is formed and using the said form in which an aperture comprising a plurality of substantially parallel extending rectangular portions is provided in the deposited polycrystalline semiconductor layer, subsequent to depositing the conductive material on the narrow strips which remain after the selective etching of the untreated polycrystalline semiconductor material and on the exposed surface parts of the insulating layer extending on opposite sides of and beyond said strips, the conductive material on said exposed surface parts of the insulating layer is defined to leave at least two groups of interconnected conductive layer portions. In this manner interdigitated electrode patterns for a two-phase operational mode for example, may be readily formed with a close spacing.

In general in a method in accordance with the invention the deposited conductive layer is applied in a thickness which is substantially less than the height of the strip of material above the substrate. Preferably the strip is provided such that it has a height above the substrate of at least two times, for example three times, that of the thickness of the metal layer parts to be deposited on the substrate at opposite sides of the strip. At this ratio it is found that a deposited metal, for example aluminium, can readily be provided to form discontinuity at the edges of the strip portion.

Embodiments of the invention will now be described, by way of example, with reference to the accompanying diagrammatic drawings, in which.

Referring now to FIG. 1 there will be described in a very general outline the provision of aluminium electrode layers on an insulating layer present on a semiconductor body. The manufacture of a practical device, for example a charge coupled device, having such a structure obviously will include the use of complex masking patterns to provide interconnection layers lying on peripheral insulating layer parts of greater thickness than those on which the electrode layers shown are situated and will also include diffusion stages to produce suitable input and output means of the CCD but in order to initially describe the basic steps of a method in accordance with the invention these masking patterns and other stages will not be described in detail.

Figure 1A:
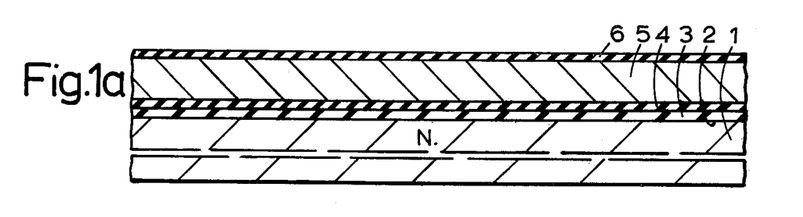
FIGS. 1a to 1f inclusive show in cross-section part of a semiconductor body and applied layers during various stages in the manufacture of a device by a method constituting a first embodiment of the invention.

The starting body is an n-type silicon wafer 1 of 250 microns thickness. On a major surface 2 of the wafer there is grown a silicon oxide layer 3 having a part 3 of 0.1 micron thickness. On the silicon oxide layer 3 there is deposited a silicon nitride layer 4 of 0.1 micron thickness. This may be effected by deposition from a mixture of silane and ammonia at 900° C. On the silicon nitride layer 4 there is deposited a layer 5 of high resistivity polycrystalline silicon of 0.6 micron thickness. This polycrystalline silicon layer 5 may be provided by any commonly used method for depositing polycrystalline silicon. On the surface of the polycrystalline silicon layer 5 there is deposited a second layer 6 of the silicon nitride of 0.1 micron thickness.

Figure 1B:
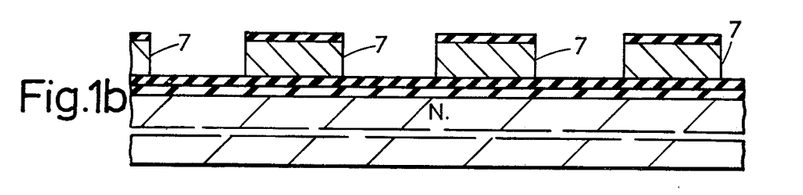

For the purpose of defining apertures in the silicon nitride layer 6 various methods as commonly used in the semiconductor art may be employed. In one method a layer of (SILOX) silicon oxide (not shown) is deposited on the silicon nitride layer 6 and using a photolithographic method with an applied photoresist layer apertures are etched in the SILOX layer and thereafter apertures are etched in the exposed parts of the silicon nitride layer 6. Using the parts of the silicon nitride layer 6 as a mask apertures 7 are etched in the polysilicon layer 5 using an etching fluid consisting of 180 c.c. of ethylene diamine, 30 gms. of pyrocatechol and 80 c.c. of water. The etching is carried out at a temperature approaching the boiling point of the etching fluid. The apertures 7 have cross-dimensions of 8 microns × 80 microns and the distance between adjoining edges of two adjacent apertures is 8 microns. This results in a structure as shown in FIG. 1b.

Figure 1C:
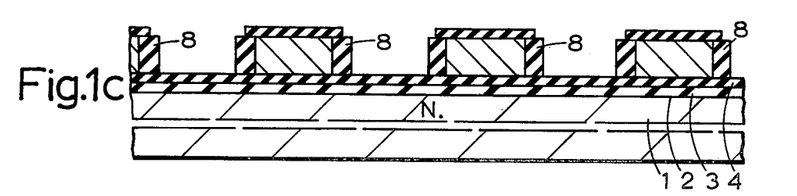

Narrow strip portions adjacent the exposed edges of the polysilicon layer 5 in the apertures 7 are converted into silicon oxide by effecting an oxidation treatment in wet oxygen for 30 minutes at 1100° C. The upper and lower silicon nitride layers 6 and 4 act as an oxidation mask and oxidation of the polysilicon layer 5 portions adjacent the edges of the apertures 7 proceeds via said edges, the growth being in a lateral direction and involving a substantially uniform rate of consumption of the polycrystalline layer. This results in the formation of narrow strips 8 of oxidized polysilicon, said strips lying partly under the silicon nitride masking layer parts 6 adjacent the edge of the apertures 7 and having a substantially uniform width of approximately 0.3 micron. FIG. 1c shows the structure after the oxidation treatment.

Figure 1D:
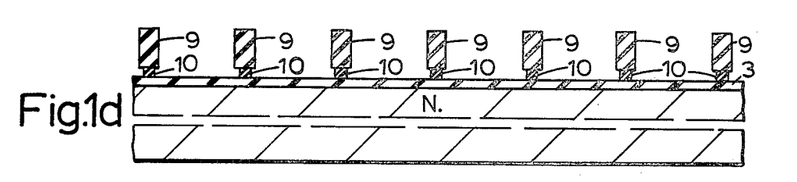

The residual parts of the silicon nitride layer 6 are removed in boiling phosphoric acid. The exposed unoxidized parts of the polysilicon layer 5 are then selectively etched in a solution which is specific for said material and does not etch silicon oxide. The same etching fluid consisting of 180 c.c. of ethylene diamine, 30 gms. of pyrocatechol and 80 c.c. water may be used for said purpose. This etching is also carried out at a temperature approaching the boiling point of said etching fluid, which is in the region of 110° C. The etching leaves parallel extending narrow strips 9 of silicon oxide of approximately 0.6 micron in height and 0.3 micron width each situated on a part of the silicon nitride layer 4 and having the parts shown in the drawing mutually spaced by a distance of approximately 7.7 microns. In the present example in which a plurality of parallel extending rectangular apertures are initially formed in the polycrystalline silicon layer the resultant parallel extending parts of the strips 9 of silicon oxide as shown in the section of FIG. 1d will not all be isolated but will be joined in pairs via the correspondingly formed parts of the strips of silicon oxide along the shorter sides of the apertures. However in a practical embodiment as will be described hereinafter the aperture definition may be slightly different in order to yield the desired configuration and interconnection of the finally formed closely spaced conductive layers. The strips are well defined with straight edges and of substantially uniform width. This is in part a result of the uniform and controlled rate at which the oxidation of the polysilicon was effected. A further etching step is carried out to remove the exposed parts of silicon nitride layer 4 previously located below the unoxidized polysilicon layer parts. This is effected with boiling phosphoric acid and the etching is of such a duration that in etching through the exposed parts of the layer 4 there will be a slight etching of the silicon nitride layer below the strip portions 9 of silicon oxide. This will leave the silicon oxide strip portions 9 located on strip portions 10 of silicon nitride which in turn are present on the silicon oxide layer 3 as is shown in FIG. 1d.

Figure 1E:
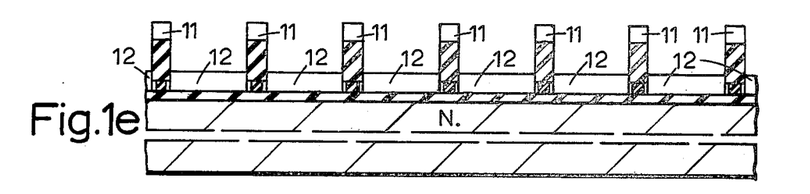

The structure is placed in a conventional evaporation deposition apparatus for depositing a layer of aluminium. A layer of aluminium of 0.2 micron thickness is deposited and due to the surface configuration including the raised silicon oxide strips 9 the aluminium is deposited as discrete portions 11 on the surface of the strips 9 and as discrete portions 12 situated on the silicon oxide layer 3 at opposite sides of the strips 9, dicontinuities thus being formed in the deposited aluminium at the edges of the raised strips 9 of oxidized polysilicon. FIG. 1e shows the structure after the aluminium deposition.

An etching treatment is effected to remove the narrow strips 9 with the deposited aluminium layers 11 thereon. In the present example this is effected by etching in buffered hydrofluoric acid. Thereafter the silicon nitride layer parts 10 are removed by a plasma etching process.

Figure 1F:
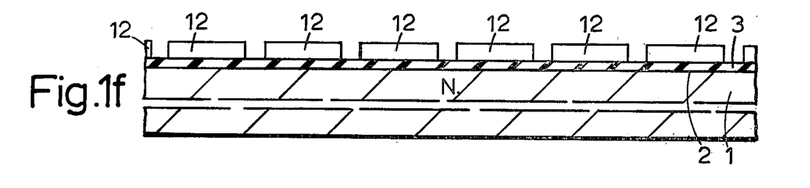

There remains, as shown in FIG. 1f, a structure in which conductive layers 12 of aluminium of 0.2 micron thickness and in the form of linear strips of approximately 7.7 microns width and mutually spaced by distances of 0.3 micron are situated on a silicon oxide layer 3 of 0.1 micron thickness present on the surface 2 of the silicon body 1.

Referring now to FIG. 2 there will be described in a general outline an embodiment of the method which is a modification of the embodiment described with reference to FIG. 1.

Figure 2A:
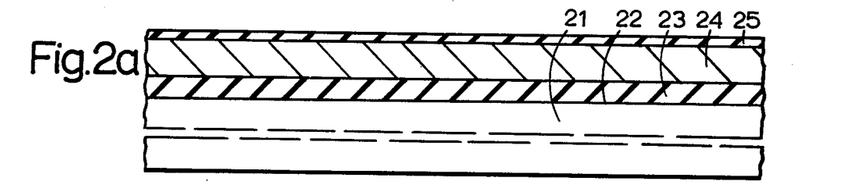
FIGS. 2a to 2f inclusive show in cross-section part of another semiconductor body and applied layers during various stages in the manufacture of a device by a method constituting a second embodiment of the invention.

The starting body is an n-type silicon body 21 of the same dimensions as used in the previous embodiment. On a major surface 22 there is grown a silicon oxide layer having a part 23 of 0.4 micron thickness. On the silicon oxide layer there is deposited a high resistivity polycrystalline silicon layer 24 of 0.6 micron thickness and a silicon nitride layer 25 of 0.1 micron thickness as in the previous embodiment. FIG. 2a shows the structure after the deposition of these layers.

Figure 2B:
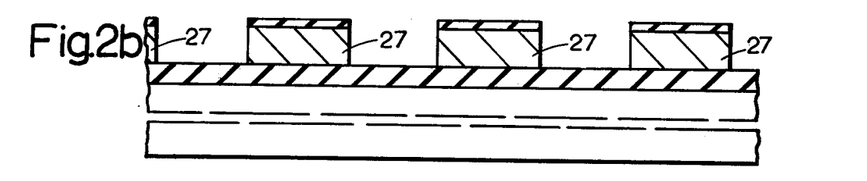

By a similar process to that used in the previous embodiment apertures are formed in the silicon nitride layer 25 and apertures 27 etched in the underlying polycrystalline silicon layer 24. The apertures have cross-dimensions of 8 microns × 80 microns and adjoining apertures are mutually spaced by a distance of 8 microns. FIG. 2b shows the structure after forming the apertures 27 in the polysilicon layer 24.

Figure 2C:
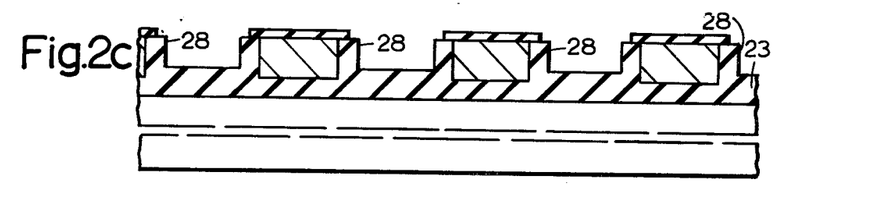

Narrow strip portions 28 adjacent the exposed edges of the polysilicon layer 24 in the apertures 27 are converted into silicon oxide by effecting an oxidation treatment in wet oxygen for 30 minutes at 1100° C. The upper silicon nitride layer parts 25 act as a mask against oxidation. Oxidation of the polysilicon layer portions adjacent the edges of the apertures 27 proceeds via said edges, the growth being in a lateral direction and involving a substantially uniform rate of consumption of the polycrystalline layer. Also during this period the thickness of those parts of the silicon oxide layer 23 exposed in the apertures is increased by an amount of between 0.05 micron and 0.15 micron. The oxidation of the polysilicon edges results in the formation of narrow strips 28 of oxidized polysilicon, said strips lying under the silicon nitride masking layer 25 parts adjacent the edges of the apertures 27 and having a substantially uniform width of approximately 0.3 micron. FIG. 2c shows the structure after the oxidation treatment.

Figure 2D:
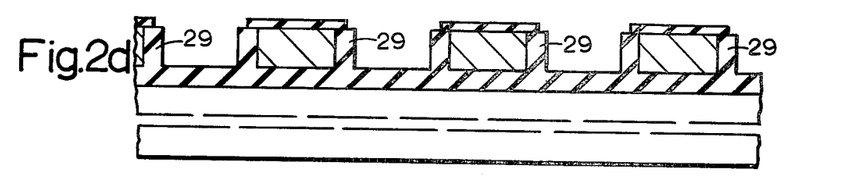

A light etching treatment with buffered hydrofluoric acid is carried out to reduce the thickness of the parts of the silicon oxide layer 23 in the apertures to their original value. This is accompanied by an equivalent etching of the oxidized polysilicon strips 28. This results in the formation of strips 29 of oxidized polysilicon of 0.2 micron width as shown in FIG. 2d.

The residual parts of the silicon nitride layer 25 are removed in boiling phosphoric acid. The exposed unoxidized portions of the polysilicon layer 24 are then selectively etched in a solution of the same composition as used in the previous embodiment, viz, 180 c.c. of ethylene diamine, 30 gms. of pyrocatechol and 80 c.c. of water. The etching is carried out at a temperature approaching the boiling point of the etching fluid. This etching leaves narrow strips 29 of silicon oxide of approximately 0.6 micron in height and 0.2 micron width each situated on and raised above the general level of the silicon oxide layer 23.

Figure 2E:
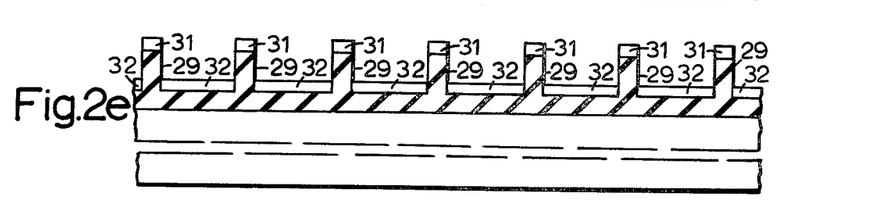

The structure is placed in a conventional evaporation deposition apparatus for depositing a layer of aluminum. Deposition of a layer of 0.2 micron thickness is effected and due to the surface configuration including the raised silicon oxide strips 29 the aluminium is deposited as discrete portions 31 on the surfaces of the strips 29 and as discrete portions 32 situated on the silicon oxide layer 23 at opposite sides of the strips 29. Discontinuities are formed in the deposited aluminium at the edges of the raised strips of silicon oxide (oxidized polysilicon). FIG. 2e shows the structure after the aluminium deposition.

An etching treatment is effected to remove the narrow strips 29 of silicon oxide with the deposited aluminium layers 31 thereon. In the present example this is effected by etching with buffered hydrofluoric acid, the etching being carried out for a time such that silicon oxide of the original layer 23 below the level of the deposited aluminium layer parts is not removed and these aluminium layer parts are substantially unattacked.

Figure 2F:
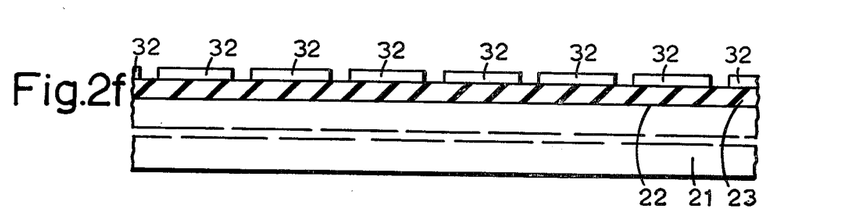

These remains, as shown in FIG. 2f, a structure in which conductive layers 32 of aluminium of 0.2 micron thickness and in the form of linear strips of approximately 7.8 microns width and mutually spaced by distances of 0.2 micron are situated on parts of a silicon oxide layer 23 of 0.4 micron thickness present on the surface 22 of the silicon body 21.

Referring now to FIGS. 3 to 6 there will be described the formation of a two-phase charge coupled device by a method in accordance with the invention which method in terms of the steps required to form the closely spaced conductive layers corresponds to the steps of a method as described with reference to FIG. 1 or FIG. 2.

Figure 3:
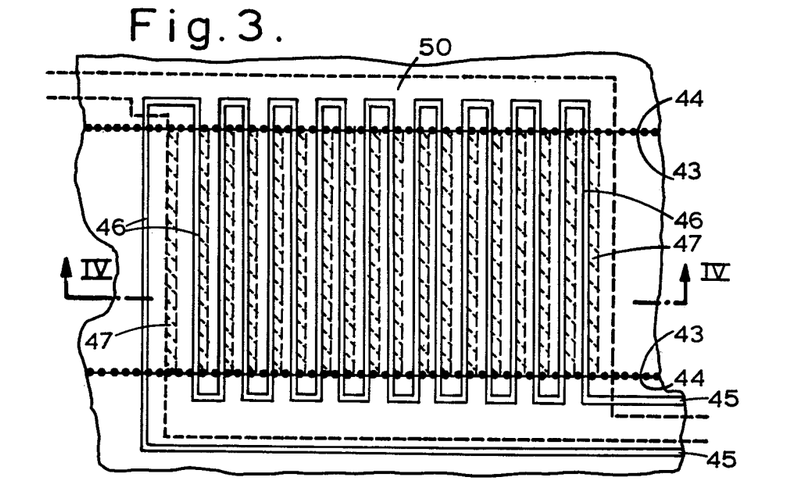
FIG. 3 shows in plan view part of a simplified form of a two-phase charge coupled device during a stage in the manufacture by a method in accordance with the invention.

The two-phase charge coupled device is shown in simplified form in so far as the input and output means are not illustrated and in practice the masking will have to be suitably adapted to accommodate said means. The device comprises an n-type silicon body 41 having on a surface 42 an insulating layer of silicon oxide including a relatively thin part 43 and a relatively thicker part 44. By a method as described with reference to FIG. 1 or FIG. 2 an aperture is formed in a deposited polycrystalline silicon layer present on the silicon oxide layer surface and an oxidation treatment is effected followed by a selective etching treatment to form a strip pattern of oxidized polysilicon (silicon oxide). FIG. 3 shows in plan view the strip pattern 45, 46 of silicon oxide which comprises a plurality of substantially parallel extending strips 46. In this particular embodiment a single aperture is initially formed in the deposited polycrystalline silicon layer, said aperture being in the form of a comb having a plurality of substantially parallel extending rectangular portions. Thus in FIG. 3 in which the subsequently formed strip pattern 45, 46 of silicon oxide is that part lying between the two closely spaced and parallel extending solid lines, the masking to define the extent of the aperture formed in the previously deposited polycrystalline silicon layer corresponds substantially to the comb-shaped portion bounded by the inner one of said two solid lines.

Figure 4:
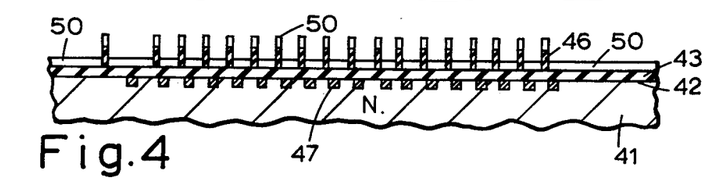
FIG. 4 is a cross-section taken along the line IV—IV of FIG. 3.
Figure 5:
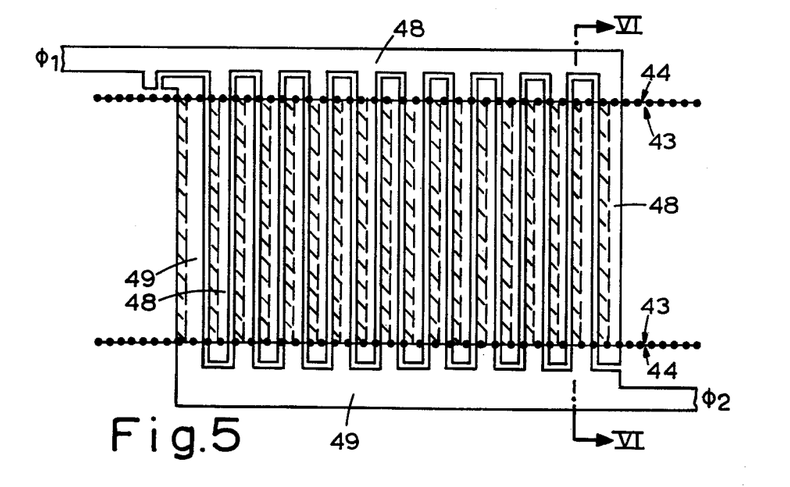
FIG. 5 shows in plan view the part of the simplified form of charge coupled device shown in FIG. 3 but at a later stage in the manufacture.

In FIGS. 3 and 5 the boundary between the thinner silicon oxide layer part 43 and the thicker silicon oxide layer part 44 is indicated by a continuous line of dots. FIGS. 3 and 4 show the device at a stage in the method subsequent to depositing an aluminum layer 50 on the entire upper surface of the structure so that aluminium is present on the upper surface of the strip pattern 45, 46 of silicon oxide consisting of oxidized polysilicon and is also present on the silicon oxide layer parts 43 and 44 where present on opposite sides of said strip pattern. In the silicon body 41 below portions of the thinner silicon oxide layer 43 there are more highly doped n-type ion implanted strip-like surface regions 47. These, with one exception, are situated immediately adjacent one side of each of the parallel extending strips 46 of the pattern of silicon oxide. The exception is the one on the left-hand side of FIG. 3 where it is located approximately intermediate between the two more widely spaced rectangular strips 46 of the pattern of silicon oxide. These ion implanted surface regions 47 are provided in order to yield the desired asymmetry required for obtaining a two-phase CCD action. The ion implantation step for producing said regions can be effected at a stage in the processing following the definition of the strip pattern of oxidized polysilicon, for example when the structure is as shown in FIG. 1d or FIG. 2d, by using a suitably defined photoresist layer for masking the incidence of the ion beam. In this manner the ion implanted regions 47 can be formed where desired below the thinner silicon oxide layer 43.

Figure 6:
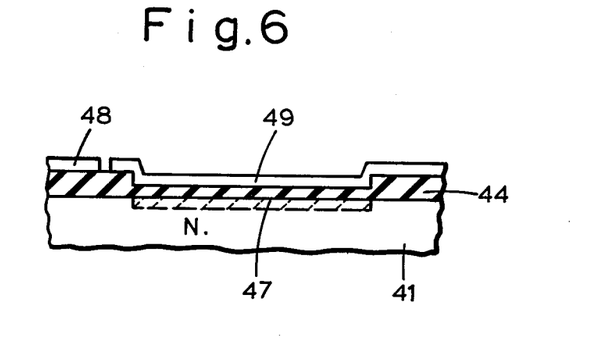
FIG. 6 is a cross-sectional view taken along the line VI—VI of FIG. 5.

In this embodiment there is a further masking stage employed after removing the strip pattern 45, 46 of oxidized polysilicon. This consists of the definition of the deposited aluminium layer by a photomasking and etching process. In FIG. 3 there is shown bounded by a broken line the area within which in said definition the deposited aluminium is retained. Following this definition of the aluminium layer and the removal of the strip pattern 45, 46 of oxidized polysilicon together with the deposited aluminium thereon a structure as is shown in FIGS. 5 and 6 is obtained. Thus the aluminium is defined as a plurality of alternately situated and closely spaced layers 48 and 49 of rectangular surface area and interconnected in two groups as indicated by the lines to which in operation clock voltages $\phi_1$ and $\phi_2$ respectively can be applied.

As previously mentioned, in a practical embodiment of a two-phase charge coupled device of the form shown in FIGS. 3 to 6 it will be necessary to provide suitable input and output means. Thus depending upon the particular application of the charge coupled device, for example imaging applications in which separate input electrode means associated with the input may or may not be required, or signal processing applications in which in the majority of cases electrode means associated with the signal input and signal output will be required, the masking patterns used to define the aperture in the polysilicon layer and to define the subsequently applied aluminium layer will have to be adapted to said particular application.

Referring now to FIGS. 7 to 10 there will now be described the formation of a four-phase charge coupled device by a method in accordance with the invention which method corresponds substantially to the method described in the previous embodiment with certain exceptions as will be described.

Figure 7:
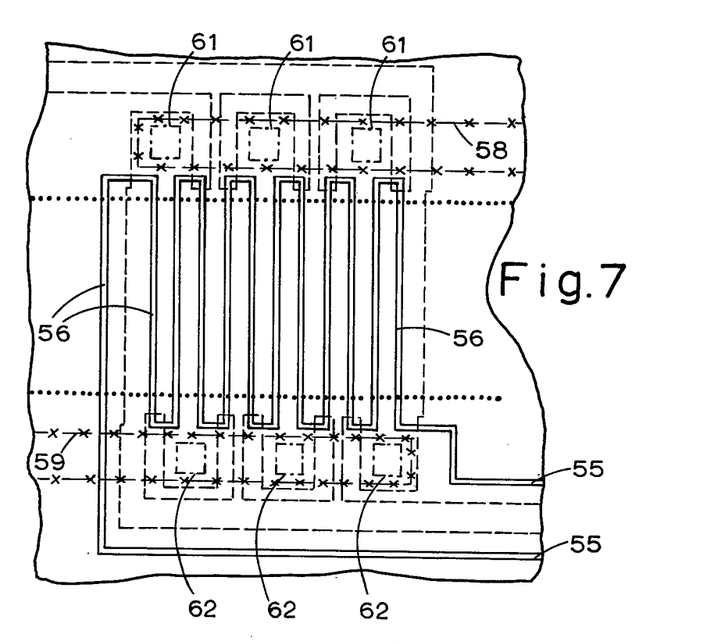
FIG. 7 shows in plan view part of a simplified form of a four-phase charge coupled device during a stage in the manufacture by a method in accordance with the invention.

The four-phase charge coupled device is shown in a simplified form in so far as the input and output means are not illustrated and the same considerations apply for the provision of said means as discussed with reference to the preceding embodiment. The device comprises an n-type silicon body 51 having on a surface 52 an insulating layer of silicon oxide including a relatively thin part 53 and a relatively thicker part 54. By a method as described with reference to FIG. 1 or FIG. 2 an aperture is formed in a deposited polycrystalline silicon layer present on the silicon oxide layer surface and an oxidation treatment is effected followed by a selective etching treatment to form a strip pattern of oxidized polysilicon (silicon oxide). FIG. 7 shows in plan view the strip pattern 55, 56 of silicon oxide which comprises a plurality of substantially parallel extending and interconnected strips 56. In this embodiment the pattern is formed in a manner as described in the previous embodiment.

Figure 8:
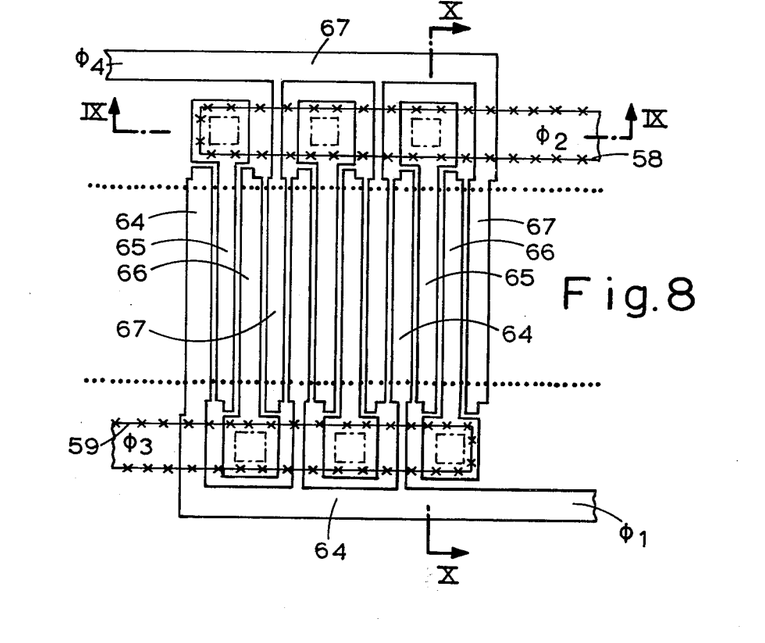
FIG. 8 shows in plan view the part of the simplified form of charge coupled device shown in FIG. 7 but at a later stage in the manufacture.

In FIGS. 7 and 8 the boundary between the thinner silicon oxide layer part 53 and the thicker silicon oxide layer part 54 is indicated by a continuous line of dots. FIG. 7 shows the device at a stage in the method subsequent to depositing an aluminium layer on the entire upper surface of the structure so that aluminium is present on the upper surface of the strip pattern 55, 56 of silicon oxide and is also present on the silicon oxide layer parts 53, 54 where present at opposite sides of said strip pattern.

In the silicon body 51 below the thicker silicon oxide layer parts 54 situated at opposite sides of the centrally situated thinner silicon oxide layer part 53 there are two p-type surface regions 58 and 59 each of rectangular surface configuration and both indicated in FIG. 7 by a chain line. These regions, which may be formed at a stage in the processing prior to applying the thicker silicon oxide layer 54, in the present embodiment are regions formed by diffusion of boron into the silicon body. However said regions alternatively may be formed by an ion implantation process.

In the thicker silicon oxide layer part 54 above the p-type region 58 there are contact windows 61 and in said silicon oxide layer part 54 above the p-type region 59 there are contact windows 62. Via said contact windows 61 and 62 the deposited aluminium layer makes contact with the p-type regions 58 and 59 respectively.

Figure 9:
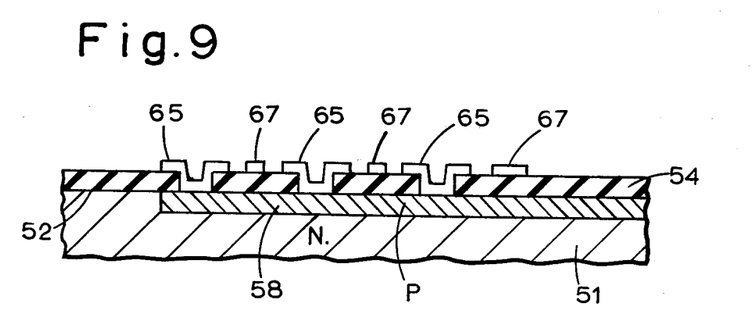
FIGS. 9 and 10 are cross-sectional views taken along the lines IX—IX and X—X respectively of FIG. 8.
Figure 10:
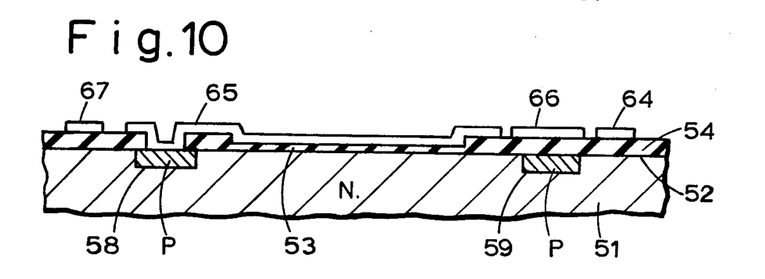

In this embodiment, in common with the previous embodiment, there is a further masking stage employed after removing the strip pattern 55, 56 of oxidized polysilicon. This consists of the definition of the deposited aluminium layer by a photomasking and etching process. In FIG. 7 the extent of the masking used for this definition is indicated by broken lines. Following this definition of the aluminium layer and the removal of the strip pattern 55, 56 of oxidized polysilicon together with the deposited aluminium thereon a structure as shown in FIGS. 8 to 10 is obtained. The aluminium is defined as a plurality of groups of closely spaced succeeding layers 64, 65, 66 and 67 having parallel extending rectangular portions situated on the thinner silicon oxide layer part 53. The layers 64 are all interconnected by a strip portion of the deposited aluminium lying on the thicker silicon oxide layer part 54 to which strip portion in operation a clock voltage $\phi_1$ is applied. Similarly the layers 67 are all interconnected by a strip portion of the deposited aluminium lying on the thicker silicon oxide layer part 54 to which strip portion in operation a clock voltage $\phi_4$ is applied. The aluminium layers 65 are individually connected via the contact windows 61 to the p-type diffused region 58 to which, in operation, and via a suitable connection, a clock voltage $\phi_2$ is applied. Similarly the aluminium layers 66 are individually connected via the contact windows 62 to the p-type diffused region 59 to which, in operation, and via another connection a clock voltage $\phi_3$ is applied.

It will be appreciated that many modifications are possible within the scope of the present invention and in the embodiments described the processing sequence may be varied in some respects. For example, the additional photomasking and etching step used to define the deposited aluminium layer parts situated mainly on the thicker oxide layer parts as described with reference to FIG. 3 and FIG. 7 may alternatively be effected prior to removing the strip pattern of oxidized polysilicon and the aluminium deposited thereon. The particular embodiments described may be readily adapted to a process where the conversion of the edges of the polysilicon layer exposed in the aperture formed in said layer to material which is insoluble in the etchant specific for the untreated layer may be carried out by a process other than an oxidation step, for example by a diffusion step to render a narrow strip portion insoluble in a selective etchant.

The method, for example as described with reference to FIG. 1 or FIG. 2, may also be suitably employed in the formation of contact patterns in other devices, for example interdigitated emitter and base contact layers in planar transistors wherein said contact layers are provided having a relatively large area and small separation in order to reduce the effect of undesirable electron migration which can occur in devices where a relatively narrow gap having a relatively long edge length has been defined in a contact layer, for example of aluminium. It will be appreciated that in the manufacture of such transistors the processing will have to be suitably modified to enable the deposited conductive layer to contact the semiconductor body surface at opposite sides of the strip pattern of converted polycrystalline material.

The method may also be employed for providing a relatively compact electrode structure in an interdigitated electrode insulated gate field effect transistor structure having a meandering channel region, the strip pattern of converted polycrystalline material being employed to define a narrow separation between the meandering gate electrode layer and the comb-shaped source and drain contact layers respectively situated at opposite sides of the gate electrode layer along the channel area. In the processing to form such a device the strip pattern may additionally be employed as part of a masking used for defining the source and drain electrode regions by an ion implantation step. For example in a modification of the outline embodiment described with reference to FIG. 1 and for producing such a field effect transistor with an interdigitated source and drain electrode configuration, the ion implantation to define the source and drain electrode regions may be effected, for example, via the aperture formed in the polysilicon layer and at a time after defining the strip pattern 8 (FIG. 1c) and prior to removing the unoxidized polysilicon layer parts. It will be appreciated that various measures will be required to obtain the desired masking to obtain separated source and drain regions but such measures are readily carried out, for example using an additionally provided and defined photoresist layer as a masking against ion implantation, by one skilled in the art.

I claim:

1. A method of manufacturing an electronic device, comprising a plurality of closely spaced conductive layers on a substrate, said method comprising the steps of depositing on said substrate a layer of polycrystalline semiconductor material, providing at least one aperture defined in and extending through said polycrystalline layer, effecting a material treatment via an exposed edge of said polycrystalline layer in said aperture in the presence of a masking layer on said polycrystalline layer, said treatment being effected to convert a narrow strip portion of the polycrystalline layer of substantially uniform width and underlying the masking layer adjacent the aperture into material insoluble in at etchant specific for the untreated part of said polycrystalline layer, removing said masking layer and selectively removing, with the use of said etchant, the untreated polycrystalline semiconductor material to leave a narrow strip of material present on and raised above the substrate, and effecting a deposition of conductive material on the upper surface of said strip of material and on said substrate at least at opposite sides of said strip, said conductive material being deposited in a thickness less than the height of said strip above the substrate and a discontinuity in said deposited conductive material being formed at said strip.

2. A method as claimed in claim 1, wherein said material treatment effected via an exposed edge of said deposited polycrystalline semiconductor layer in the aperture comprises an oxidation treatment to convert said narrow strip portion into an oxide of the semiconductor material of said polycrystalline layer.

3. A method as claimed in claim 1, wherein said substrate comprises a body having insulating material provided on a surface thereof, said polycrystalline semiconductor material being deposited on a surface of said insulating material.

4. A method as claimed in claim 3, wherein said insulating material provided on said surface of the body comprises a first layer of silicon oxide and a second layer of silicon nitride, said deposited polycrystalline semiconductor material being of silicon and being provided on said silicon nitride layer, said at least one aperture being provided and extending through the deposited polycrystalline silicon layer but not through the silicon nitride layer.

5. A method as claimed in claim 4, wherein, subsequent to said selective etching of said untreated polycrystalline silicon to leave a narrow strip of silicon oxide and prior to the deposition of the conductive material, the silicon nitride layer part in the aperture is removed to expose the underlying silicon oxide layer part.

6. A method as claimed in claim 5, wherein said narrow strip of silicon oxide with the deposited conductive material thereon is removed by the etching of the remaining silicon nitride layer part present under said strip.

7. A method as claimed in claim 3, wherein said insulating material provided on the surface of said body comprises a layer of silicon oxide, said deposited polycrystalline semiconductor layer is of silicon and is provided on said silicon oxide layer, and said at least one aperture is provided extending through said polycrystalline silicon layer but not into the underlying silicon oxide layer.

8. A method as claimed in claim 7, wherein, during the oxidation treatment, the thickness of the silicon oxide layer part located in the aperture increases, and subsequent to said oxidiation treatment and prior to the selective etching of said untreated polycrystalline silicon, an etching of said silicon oxide within the aperture is effected to reduce the thickness of the silicon oxide layer part in the aperture substantially to its value prior to the oxidation treatment.

9. A method as claimed in claim 7, wherein subsequent to the deposition of the conductive material the strip of silicon oxide with the deposited conductive material thereon is removed by etching of the silicon oxide strip.

10. A method as claimed in claim 1, wherein an aperture comprising a plurality of substantially parallel extending rectangular portions is defined in the deposited polycrystalline semiconductor layer and the edges of the polycrystalline semiconductor material therein subjected to the treatment to form substantially parallel extending narrow strips of material which remain after said selective etching of the untreated polycrystalline semiconductor material.

11. A method as claimed in claim 10, wherein said parallel extending substantially rectangular portions of said aperture have a mutual spacing between adjoining edges which is approximately equal to their cross-dimension perpendicular to said adjoining edges.

12. A method as claimed in claim 1, wherein said substrate comprises a body of semiconductor material having an insulating layer on one surface, the semiconductor body, insulating layer and applied conductive material in the form of closely spaced conductive layers constituting a charge coupled device.

13. A method as claimed in claim 12, wherein subsequent to depositing the conductive material on the narrow strips of material which remain after the selective etching of the untreated polycrystalline semiconductor material and on the exposed surface parts of the insulating layer extending on opposite sides of and beyond said strips, the conductive material on said exposed surface parts of the insulating layer is defined to leave at least two groups of interconnected conductive layer portions.

14. A device comprising a plurality of closely spaced conductive layers when manufactured by the method claimed in claim 1.

* * * * *

UNITED STATES PATENT OFFICE
CERTIFICATE OF CORRECTION

Patent No. 4,083,098            Dated April 11, 1978

Inventor(s) KEITH H. NICHOLAS

It is certified that error appears in the above-identified patent and that said Letters Patent are hereby corrected as shown below:

Column 3, line 17, "method and," should be --method,--

Column 6, line 23, "FIG. 16" should be --FIG. 1b--

Signed and Sealed this

Thirty-first Day of October 1978

[SEAL]

Attest:

RUTH C. MASON
*Attesting Officer*

DONALD W. BANNER
*Commissioner of Patents and Trademarks*